United States Patent [19]

Yasuzato et al.

[11] Patent Number: 5,060,843
[45] Date of Patent: Oct. 29, 1991

[54] PROCESS OF FORMING BUMP ON ELECTRODE OF SEMICONDUCTOR CHIP AND APPARATUS USED THEREFOR

[75] Inventors: Tadao Yasuzato; Keizo Sakurai, both of Tokyo, Japan

[73] Assignee: NEC Corporation, Japan

[21] Appl. No.: 532,219

[22] Filed: Jun. 1, 1990

[30] Foreign Application Priority Data

Jun. 7, 1989 [JP] Japan .................. 1-146356
Jun. 13, 1989 [JP] Japan .................. 1-151632

[51] Int. Cl.$^5$ .................. B23K 101/40; H01L 21/603
[52] U.S. Cl. .................. 228/179; 228/4.5; 228/160
[58] Field of Search .................. 228/179, 4.5, 904, 13, 228/14, 160

[56] References Cited

U.S. PATENT DOCUMENTS

| | | | |
|---|---|---|---|
| 3,357,090 | 12/1967 | Tiffany | 228/4.5 |
| 4,099,663 | 4/1978 | Brill et al. | 228/4.5 |
| 4,230,925 | 10/1980 | Lascelles | 228/4.5 |
| 4,442,967 | 4/1984 | van de Pas et al. | 228/179 |
| 4,717,066 | 1/1988 | Goldenberg et al. | 228/4.5 |
| 4,750,666 | 6/1988 | Neugebauer et al. | 228/4.5 |

FOREIGN PATENT DOCUMENTS

| | | | |
|---|---|---|---|
| 118643 | 9/1980 | Japan | 228/179 |
| 211740 | 12/1982 | Japan | 228/4.5 |
| 87827 | 5/1984 | Japan | 228/4.5 |
| 246644 | 12/1985 | Japan | 228/4.5 |

*Primary Examiner*—Samuel M. Heinrich
*Attorney, Agent, or Firm*—Laff, Whitesel, Conte & Saret

[57] ABSTRACT

A process of forming bumps on respective electrodes of a semiconductor chip comprises the steps of a) preparing a bonding apparatus equipped with a bonding tool three-dimensionally movable, b) forming a small ball at the leading end of a wire passing through the bonding tool, c) causing the bonding tool to press the small ball against the upper surface of one of the electrodes for bonding thereto, d) moving the bonding tool in a direction leaving from the upper surface of the electrode by a distance, e) moving the bonding tool in a horizontal direction substantially parallel to the upper surface of the electrode so that the wire is cut from the small ball with the leading end of the bonding tool, and f) repeating the steps b) to e) for producing bumps on the respective upper surfaces of the other electrodes, in which the horizontal direction is different depending upon the location of the electrode.

3 Claims, 22 Drawing Sheets

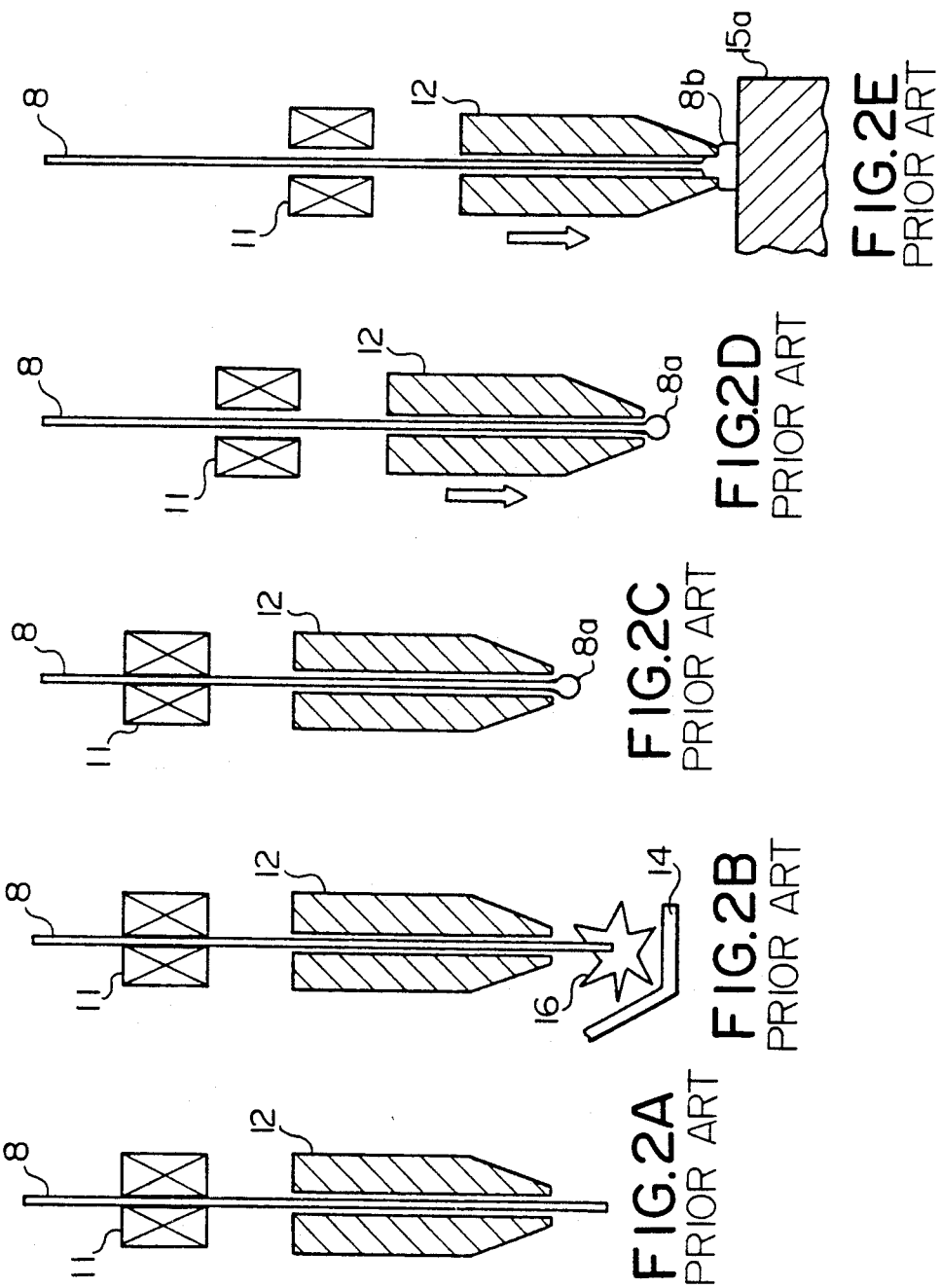

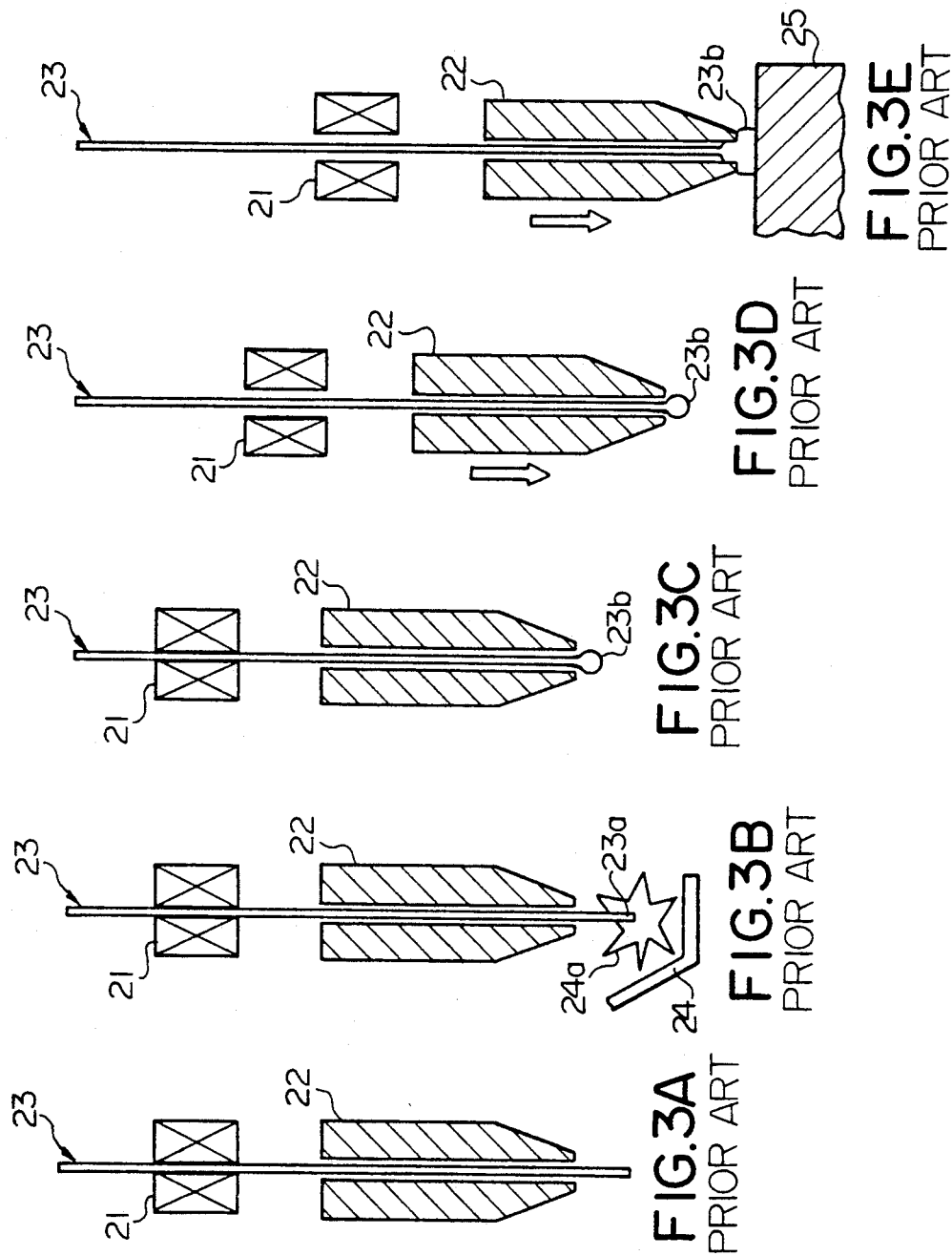

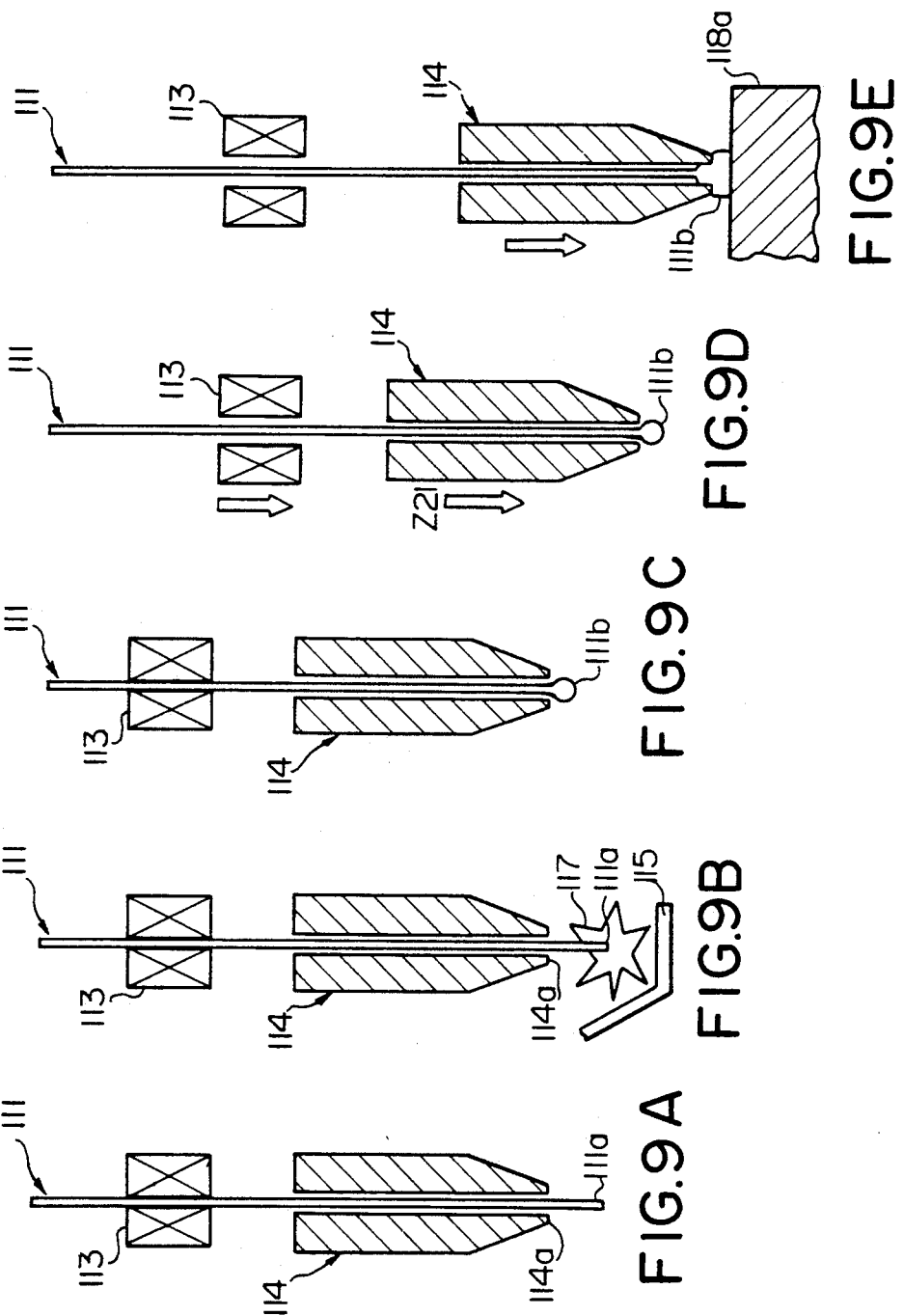

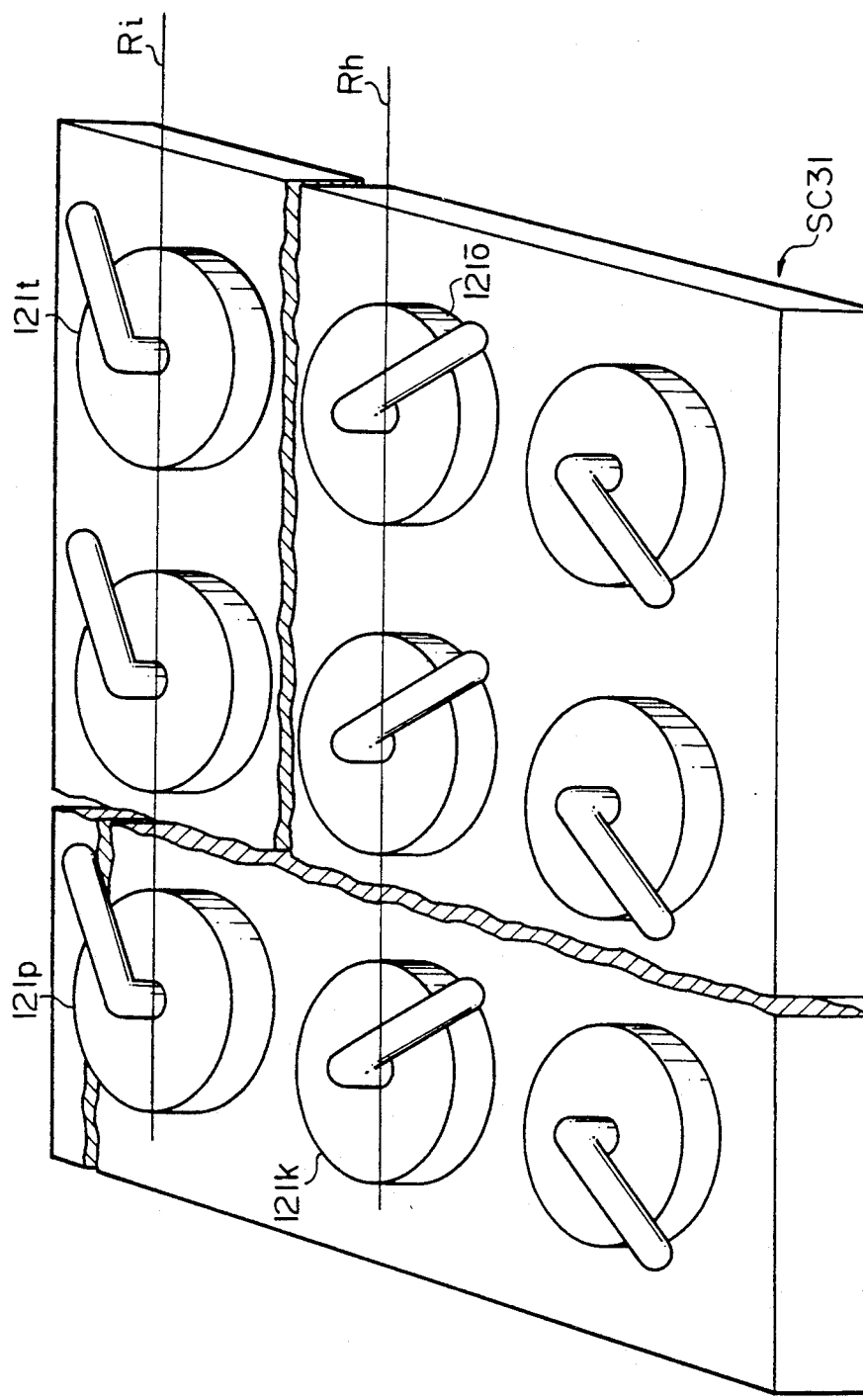

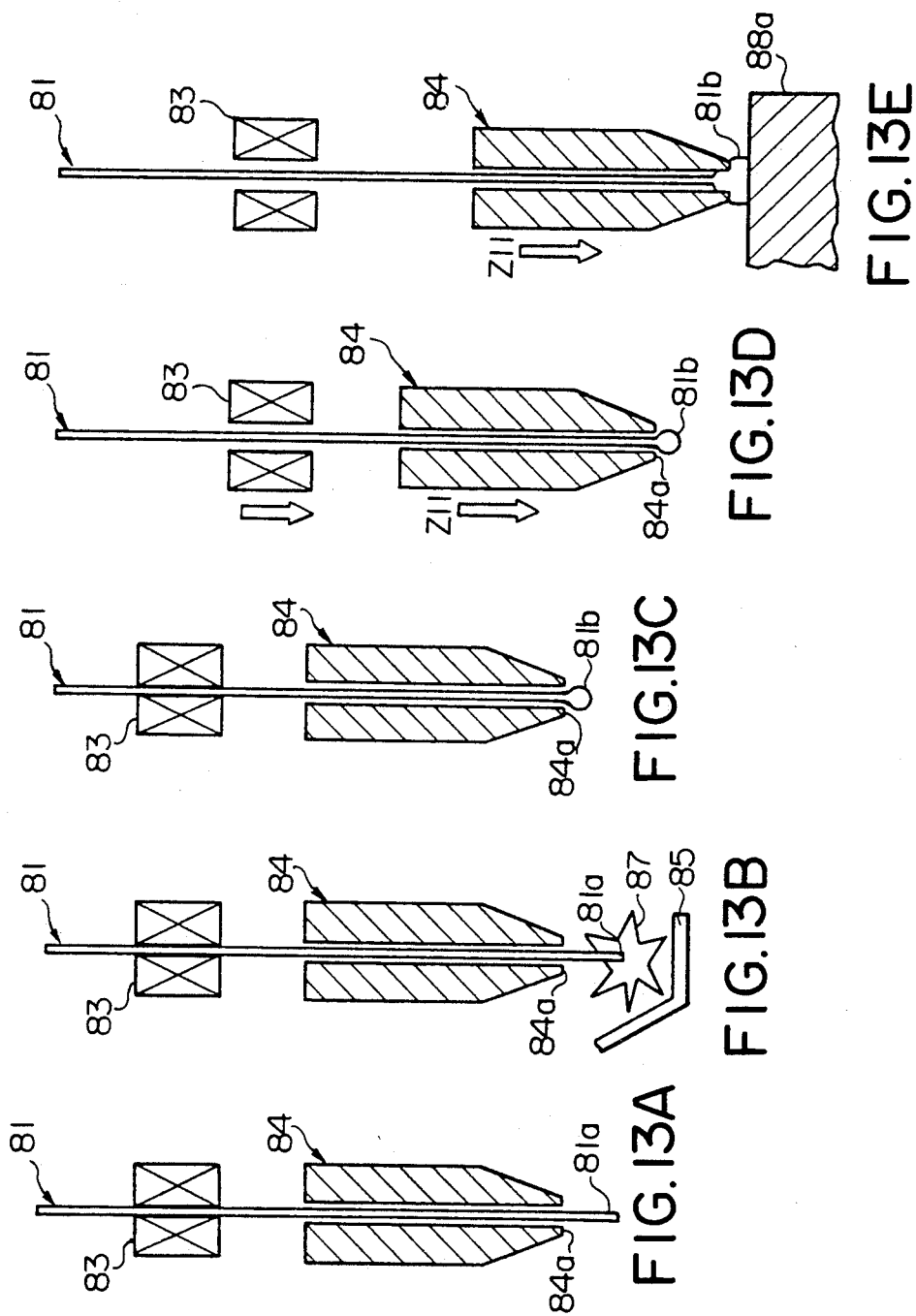

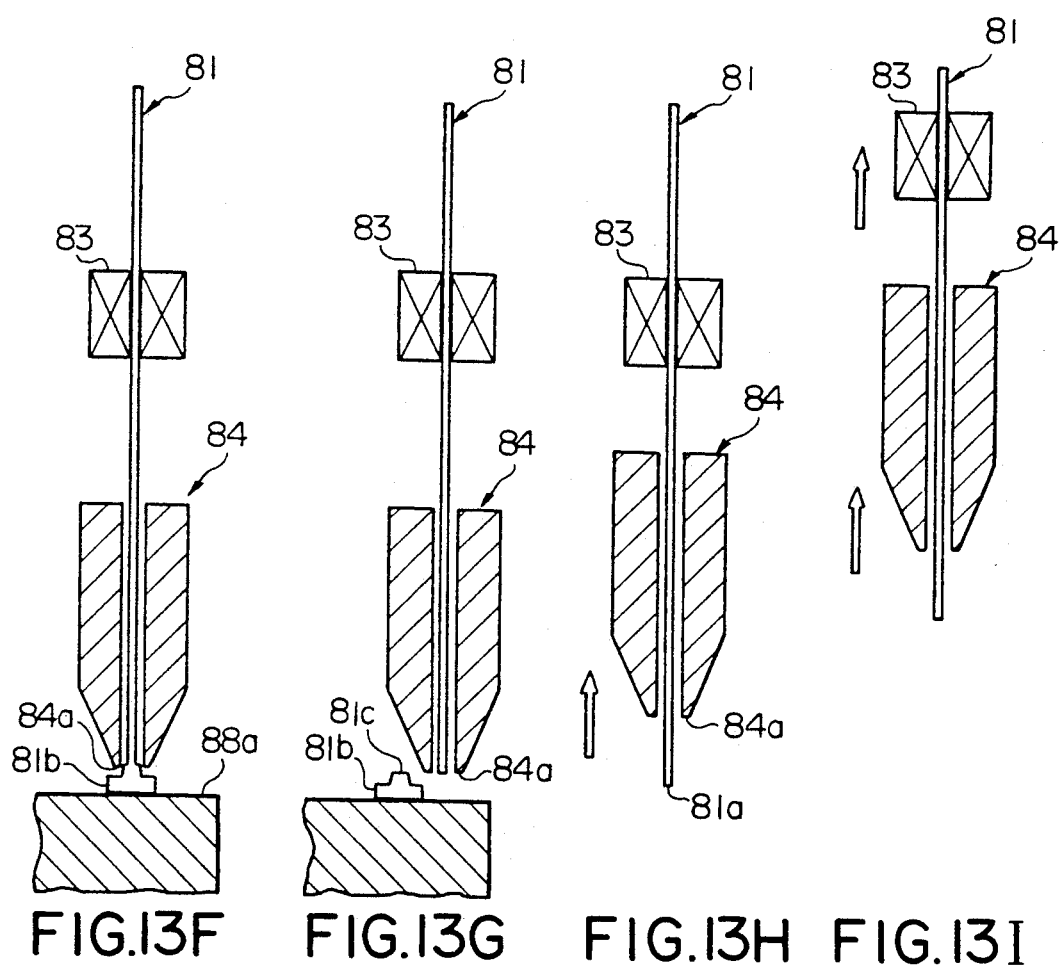

PROCESS OF FORMING BUMP ON ELECTRODE OF SEMICONDUCTOR CHIP AND APPARATUS USED THEREFOR

FIELD OF THE INVENTION

This invention relates to an assembly technique of a semiconductor device and, more particularly, to a process of forming a bump on an electrode of a semiconductor chip and an apparatus used for formation of the bump.

DESCRIPTION OF THE RELATED ART

When a semiconductor wafer is broken into a lot of semiconductor chips, each of the semiconductor chips is assembled with conductive leads on a flexible tape, and is, thereafter, packed into, for example, a resin compound. However, prior to being assembled with the conductive leads, bumps should be formed on respective electrodes provided on the top surface of the semiconductor chip.

Various bump formation technologies have been proposed, and one of them utilizes a ball bonding apparatus as shown in FIG. 1. In FIG. 1, on a frame or a bed 1 are mounded a heating plate 2 with a built-in heating 3 and a two-dimensionally movable table 4 which consists of a lower stage 5 reciprocally movable in a direction X1 normal with the sheet and an upper stage 6 reciprocally movable in a direction Y1 perpendicular to the direction X1. A bonding head 7 is fixed to the upper stage 6, and a bonding wire is wound on an outer periphery of a rotatable reel 9 provided on the bonding head 7. The bonding head 7 has a driving mechanism 10 for causing a clamper 11 and a capillary 12 to move in a direction Z1, and a leading edge of the bonding wire 8 is directed from the rotatable reel 9 through an idler wheel 13 and the clamper 11 to the capillary 12. The clamper 11 grasps and releases the bonding wire 8, and the bonding wire 8 loosely passes through the capillary 12. Though not shown in FIG. 1, a spark rod 14 (see FIG. 2B) is provided in the vicinity of the capillary 12, and sparks are struck between the spark rod 14 and the leading end of the bonding wire 8. On the heating plate 2 is mounted a semiconductor chip 15 having a lot of electrodes one of which is designated by reference numeral 15a in FIG. 2E.

The ball bonding apparatus thus constructed threedimensionally moves the leading end of the bonding wire and produces bumps on electrodes of a semiconductor chip. FIGS. 2A to 2H illustrate a prior art sequence of the forming a bump achieved by the ball bonding apparatus shown in FIG. 1, and description is hereinbelow made on the sequence in detail. Prior to starting the sequence, the clamper 11 and the capillary 12 has been lifted, and the bonding wire 8 is grasped by the clamper 11 as shown in FIG. 2A. First, the clamper 11 and the capillary 12 move the leading end of the bonding wire 8 toward the spark rod 14, then sparks 16 takes place between the spark rod 14 and the leading end of the bonding wire 8 as shown in FIG. 2B. The leading end of the bonding wire is melted in the presence of the sparks 16, and the melted metal becomes round for producing a small ball 8a at the leading end of the bonding wire 8 as shown in FIG. 2C.

Subsequently, the clamper 11 releases the bonding wire 8, and the capillary 12 downwardly moves toward the electrode 15a as shown in FIG. 2D. When the small ball 8a is brought into contact with the electrode 15a, the capillary 12 presses the small ball 8a against the electrode 15a, and the small ball 15a is crashed on the electrode 15a, thereby being bonded to the electrode 15a as shown in FIG. 2E.

The clamper 11 and the capillary 12 are lifted upwardly, and the capillary 12 is spaced from the crashed ball 8b by about 200 microns as shown in FIG. 2F. Since the clamper 11 does not grasp the bonding wire 8, the clamper 11 and the capillary 12 slide on the bonding wire 8.

The clamper 11 grasps the bonding wire 8 again, and the clamper 11 and the capillary 12 further move upwardly. Then, a tension exerts on the bonding wire 8, and the bonding wire 8 is cut at somewhere between the crashed small ball 8b and the capillary 12. The crashed small ball 8b and a residual bonding wire 8c are left on the electrode 15a and serves as a bump 17 as shown in FIG. 2H.

The bump 17 thus formed has the residual bonding wire 8c, and the projecting length thereof is not controllable, because the bonding wire 8 is broken at somewhere between the crashed ball 8b and the capillary 12. In fact, the length of the residual bonding wire 8 tends to exceed a gap between the electrodes 15a and an adjacent electrode (not shown). This results in that undesirable short-circuiting takes place between the adjacent electrodes, and the problem, i.e. the undesirable short circuiting, is serious in formation of bumps for an inner lead bonding. Such a semiconductor chip is objected as an inferior product, and deteriorates the production yield. Thus, the problem is encountered in the prior art sequence illustrated in FIGS. 2A to 2H in undesirable short circuiting between the two adjacent electrodes. Although a shaping operation is carried out for the crashed small ball 8b and the residual bonding wire 8c as similar to the second prior art example described hereinbelow, no detailed description is incorporated because of similarity to a problem inherent in the second prior art example.

Another prior art sequence is illustrated in FIGS. 3A to 3H of the drawings, and the prior art sequence is proposed in Japanese Patent Application laid-open (Kokai) No. 62-211937. The ball bonding apparatus used in the second prior art sequence is similar to that illustrated in FIG. 1, and, for this reason, description is focused on the motions of a clamper 21 and a capillary 22.

At the initial stage of the sequence, the clamper grasps a bonding wire 23, and the leading end of the bonding wire 23 loosely passes through the capillary 22 as shown in FIG. 3A. The clamper 21 and the capillary 22 move toward a spark rod 24, and sparks 24a take place between the spark rod 24 and the leading end of the bonding wire 23 as shown in FIG. 3B. The leading end 23a of the bonding wire 23 melts in the sparks 24a, and the molted metal becomes round, thereby forming a small ball 23b at the leading end of the bonding wire 23 as shown in FIG. 3C.

Subsequently, the clamper releases the bonding wire 23, and the capillary 22 goes down toward an electrode 25 of a semiconductor chip. The small ball 23b is moved together with the capillary 22 (see FIG. 3D), and the bonding wire 23 is unwound from a rotational reel. The small ball 23b is pressed onto the electrode 25 and is crashed as shown in FIG. 3E. Thus, the small ball 23b is bonded to the electrode 25 of the semiconductor chip.

The capillary 22 as well as the clamper 21 are lifted upwardly as shown in FIG. 3F, and the capillary 22 is, then, horizontally moved as shown in FIG. 3G. The horizontal motion of the capillary 22 causes the bonding wire 23 to be cut at somewhere between the crashed small ball 23b and the capillary 22, and, for this reason, a residual bonding wire 23c is left on the crashed ball 23b as shown in FIG. 3H. The horizontal motion is constant in direction regardless of the location of the electrode on the semiconductor chip. The crashed small ball 23b and the residual bonding wire 23c are shaped into a bump 26 as described with reference to FIGS. 4A to 4C.

The crashed small ball 23b and the residual bonding wire 23c are subjected to an shaping operation which is illustrated in FIGS. 4A to 4C. Namely, when the capillary 22 is lifted up, the crashed small ball 23b is connected to the bonding wire 23 as shown in FIG. 4A. The bonding wire 23 is cut off at somewhere between the crashed small ball 23b and the capillary 22 by the horizontal movement of the capillary 22, then the residual bonding wire 23c is left on the crashed small ball 23c as shown in FIG. 4B. The length of the residual bonding wire 23c is not so uniform that the residual bonding wire 23c is subject to shaping with a die member 27 as shown in FIG. 4C.

However, a problem is encountered in the prior art sequence in that the bump tends to short circuit the electrodes adjacent to one another. In FIGS. 5A to 5C, three electrodes are labeled with 25a, 25b and 25c, and each of the bumps 26a, 26b and 26c formed on the electrode 25a, 25b or 25c consists of the crashed small ball 23ba, 23bb or 23bc and the residual bonding wire 23ca, 23cb or 23cc. After repetition of the sequence illustrated in FIGS. 3A to 3H, the bumps 26a, 26b and 26c are formed on the electrodes 25a, 25b and 25c, respectively, as shown in FIG. 5A. Since the capillary 22 repeatedly moves in directions indicated by allows A1 and A2, the residual bonding wires 23ca to 23cc tend to decline either direction A1 or A2. The die member 27 goes down and presses the residual bonding wire 23ca as shown in FIG. 5B, and the residual bonding wire 23ca is subjected to deformation. However, since the length of each residual bonding wire 23ca, 23cb or 23cc is not precisely controlled, the bonding wire 23 is cut at somewhere between the crashed small ball 23ba, 23bb or 23bc and the capillary 22, and, accordingly, dispersion takes place in the length. A residual bonding wire with length of the order of 100 microns takes place as the residual bonding wire 23ca. This means that some of the residual bonding wires such as 23ca is long enough to bridge a gap between the adjacent creased small balls 25ba and 25bb.

If electrodes 31a to 31z are arranged along the periphery of the major surface of a semiconductor chip 32 as shown in FIGS. 6A and 6B, the electrodes provided along the lateral edges 32a and 32b tends to be short circuited by bumps such as 33g and 33h, because the capillary 22 moves in a direction indicated by allow A3 at all times for cutting the bonding wire.

Another process of forming a bump on an electrode of a semiconductor chip and an apparatus used therein are disclosed in Japanese Patent Application laid-open No. 64-12555, and the process is similar to that shown in FIGS. 2A to 2H. Namely, the capillary is upwardly lifted by a predetermined distance equal to or three times larger than the diameter of the wire, and, then, laterally moves so as to cut the wire somewhere between the crashed small ball and the leading edge of the capillary. However, the lateral movement of the capillary is identical in direction regardless of the location of the electrode on the semiconductor chip.

SUMMARY OF THE INVENTION

It is therefore an important object of the present invention to provide a process of forming a bump on an electrode of a semiconductor chip which is not causative of any short circuiting.

It is also an important object of the present invention to provide an apparatus used for formation of the bump which is not causative of any short circuiting.

To accomplish these objects, the present invention proposes to change a direction of a lateral movement of a bonding tool depending upon the location of an electrode where a bump is formed.

In accordance with one aspect of the present invention, there is provided a process of forming bumps on respective electrodes of a semiconductor chip, the electrodes being arranged in at least first and second columns, comprising the steps of: a) preparing a bonding apparatus equipped with a bonding tool movable in a first horizontal direction substantially parallel to an upper surface of the electrode, in a second horizontal direction substantially parallel to the upper surface of the electrode and substantially perpendicular to the first horizontal direction and in a vertical direction perpendicular to the upper surface of the electrode, a wire passing through the bonding tool; b) forming a small ball at the leading end of the wire, the small ball projecting from the leading end of the bonding tool; c) causing the bonding tool to press the small ball against the upper surface of one of the electrodes in the first column for bonding thereto; d) moving the bonding tool in a direction leaving from the upper surface of the electrode; e) moving the bonding tool in a predetermined direction on a virtual plane defined by the first and second horizontal directions so that the wire is cut from the small ball with the leading end of the bonding tool, a residual wire being left on the small ball; and f) repeating the steps b) to e) for producing bumps on respective upper surfaces of the other electrodes, in which the predetermined direction for producing the bump on aforesaid one of the electrodes in the first column is different from that for producing the bump on the upper surface of another electrode in the second column.

In accordance with another aspect of the present invention, there is provided a process of forming a bump on an electrode of a semiconductor chip adjacent to another electrode, comprising the steps of: a) preparing a bonding apparatus equipped with a bonding tool movable in a first horizontal direction substantially parallel to an upper surface of the electrode, in a second horizontal direction substantially parallel to the upper surface of the electrode and substantially perpendicular to the first horizontal direction and in a vertical direction perpendicular to the upper surface of the electrode, a wire passing through the bonding tool; b) forming a small ball at the leading end of the wire, the small ball being projecting from a leading end of the bonding tool; c) causing the bonding tool to press the small ball against the upper surface of the electrode for bonding thereto; d) moving the bonding tool in a direction leaving from the upper surface of the electrode by a distance decided in such a manner that a residual wire, if any, left on the small ball after the subsequent step e) hardly bridges a gap between the electrode and aforesaid another electrode, the distance being controlled with a unit value equal to or less than about 5 microns; and e) moving one of the semiconductor chip and the bonding tool in a horizontal direction substantially parallel to the upper surface of the electrode so that the wire is cut from the small ball with the leading end of the bonding tool.

In accordance with another aspect of the present invention, there is provided an apparatus for forming a bump on an electrode of a semiconductor chip mounted on a plate, comprising a) a bonding tool through which a wire passes, the bonding tool being opposed to the plate; b) a two-dimensionally movable table for allowing the bonding tool to move in a first horizontal direction substantially parallel to an upper surface of the electrode and in a second horizontal direction substantially parallel to the upper surface of the electrode and perpendicular to the first horizontal direction; c) a vertical driving mechanism for allowing the bonding tool to move in a perpendicular direction to the upper surface of the electrode; and d) ball forming means for producing a small ball at the leading end of the wire, in which the two-dimensionally movable table is accompanied with a controller for controlling a motion of the two-dimensionally movable table in any direction on a virtual plane defined by the first and second horizontal directions, and in which the bonding tool is moved in a predetermined direction in the virtual plane for cutting the wire from the small ball bonded to the electrode, the predetermined direction being variable depending upon a location of the electrode.

The controller may be further associated with the vertical driving mechanism, and the controller achieves a resolution equal to or less than about 5 microns for the vertical driving mechanism.

BRIEF DESCRIPTION OF THE DRAWINGS

The features and advantages of a process of forming a bump on an electrode of a semiconductor chip and an apparatus used therefore according to the present invention will be more clearly understood from the following description taken in conjunction with the accompanying drawings in which:

FIGS. 2A to 2H are cross sectional views showing the prior art sequence for forming a bump on an electrode of a semiconductor chip;

FIGS. 3A to 3H are cross sectional views showing another prior art sequence for forming a bump on an electrode of a semiconductor chip;

FIGS. 9A to 9I are cross sectional views showing a sequence for forming a bump according to the present invention;

FIG. 11B is a perspective view showing the arrangement of the bumps on the electrodes shown in FIG. 11A;

FIGS. 13A to 13I are cross sectional views showing another sequence of forming a bump on an electrode of a semiconductor chip according to the present invention;

DESCRIPTION OF THE PREFERRED EMBODIMENTS

First Embodiment

Figure 1:
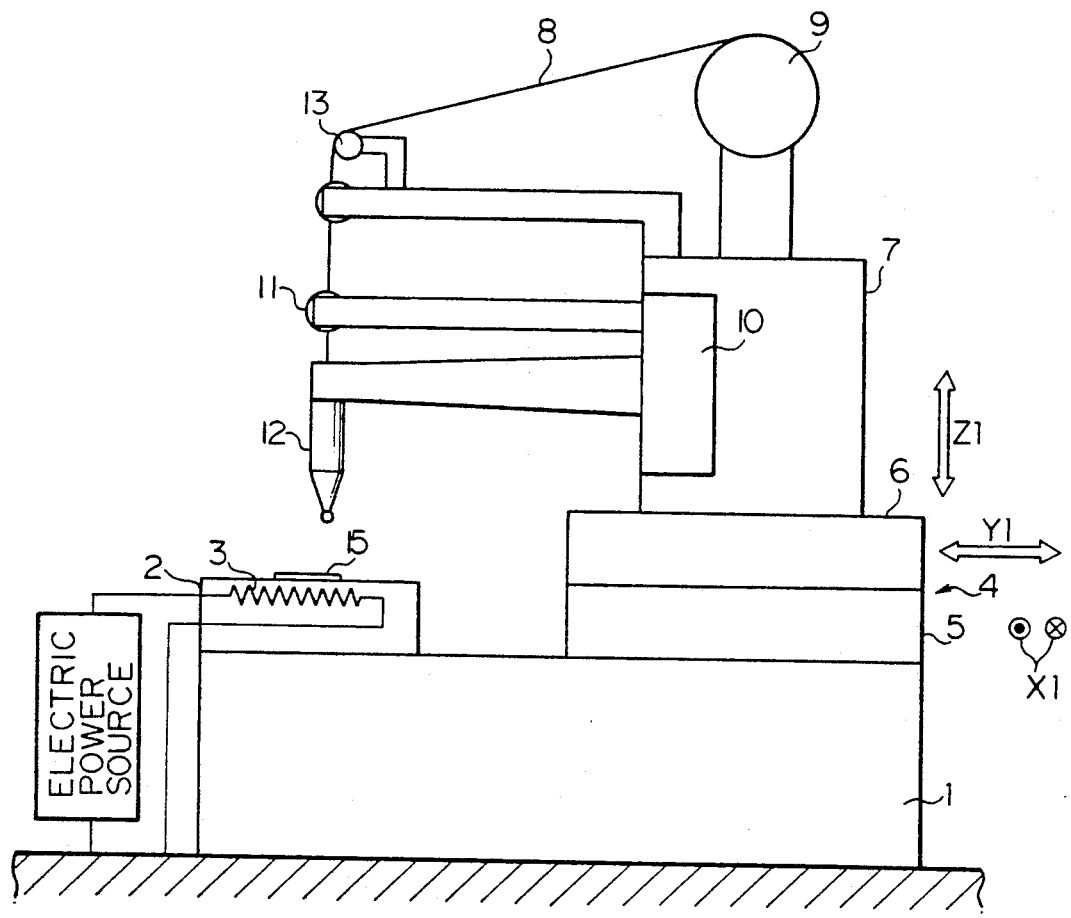
FIG. 1 is a side view showing the prior art ball bonding apparatus.
Figures 2F, 2G, 2H:
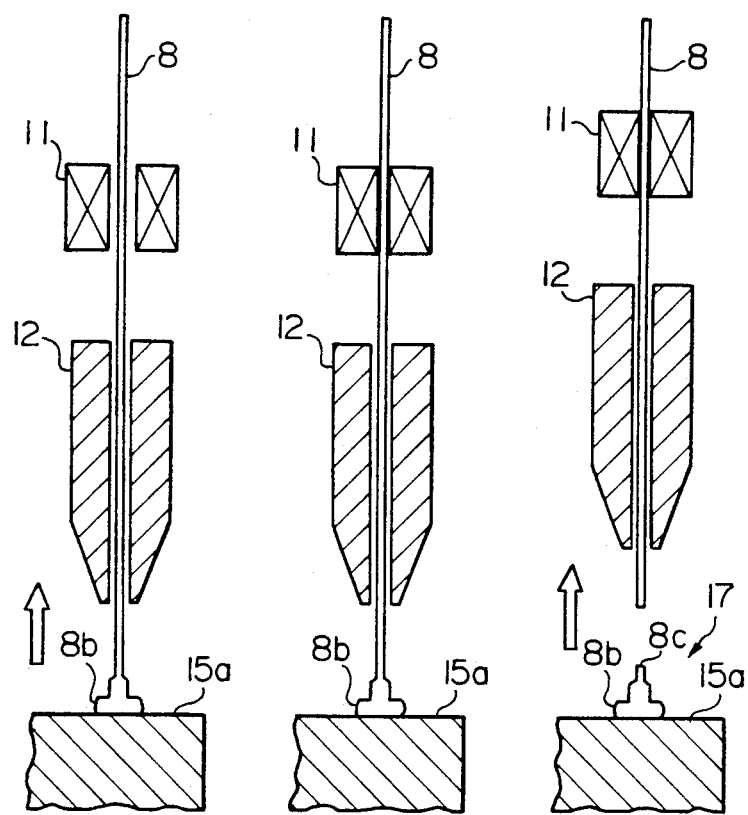
Figures 3F, 3G, 3H:
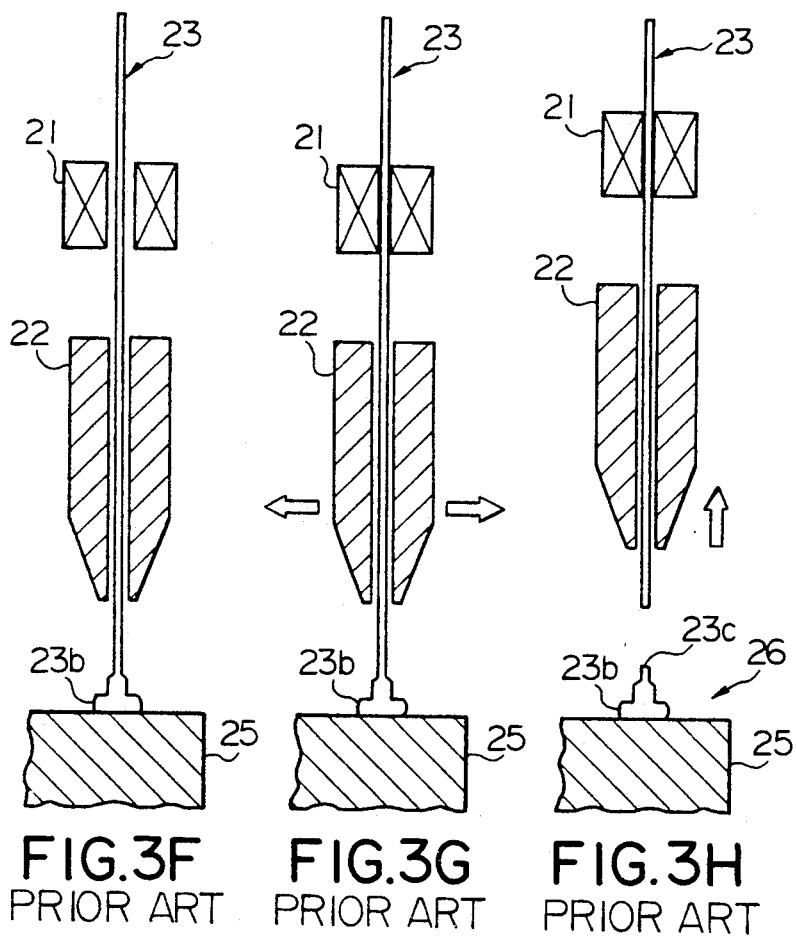
Figure 4A:
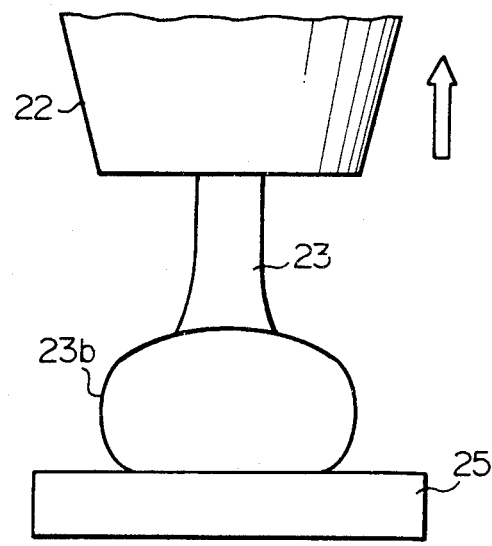
FIG. 4A to 4C are views showing the sequence of a shaping operation for producing the bump.
Figure 4B:
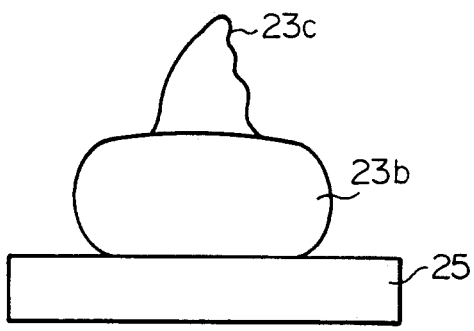
Figure 4C:
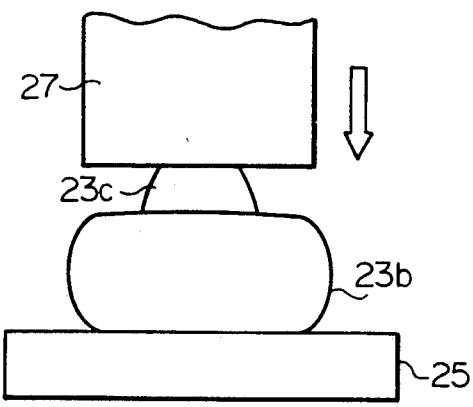
Figure 5A:
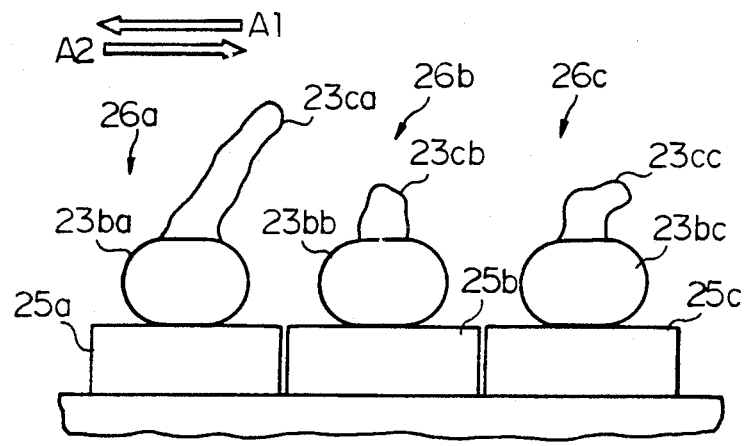
FIG. 5A to 5C describing the problem encountered in the prior art sequence shown in FIGS. 3A to 3H.
Figure 5B:
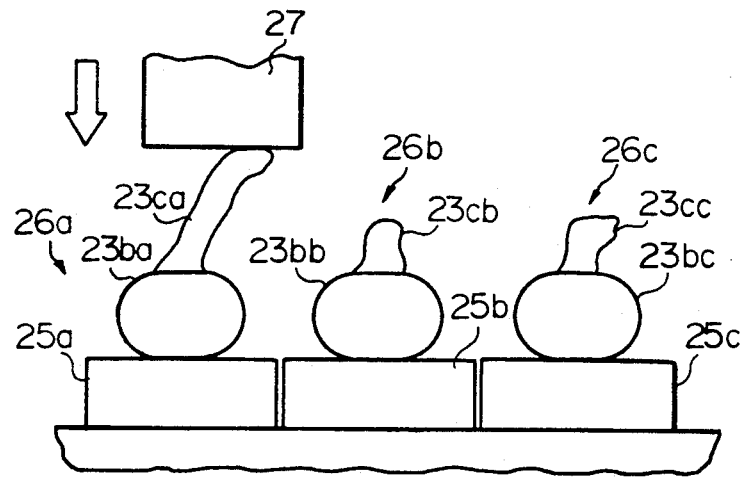
Figure 5C:
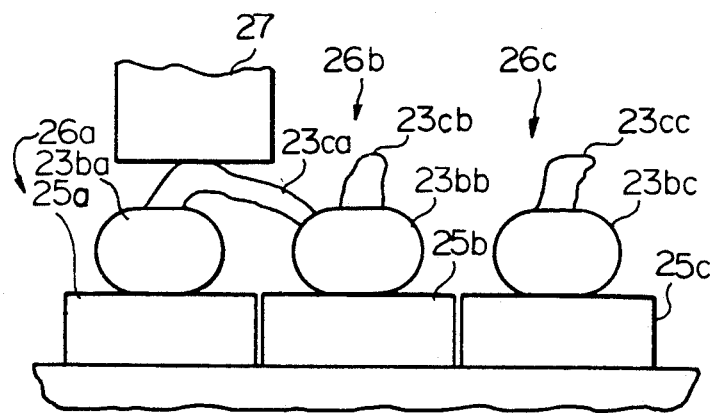
Figure 6A:
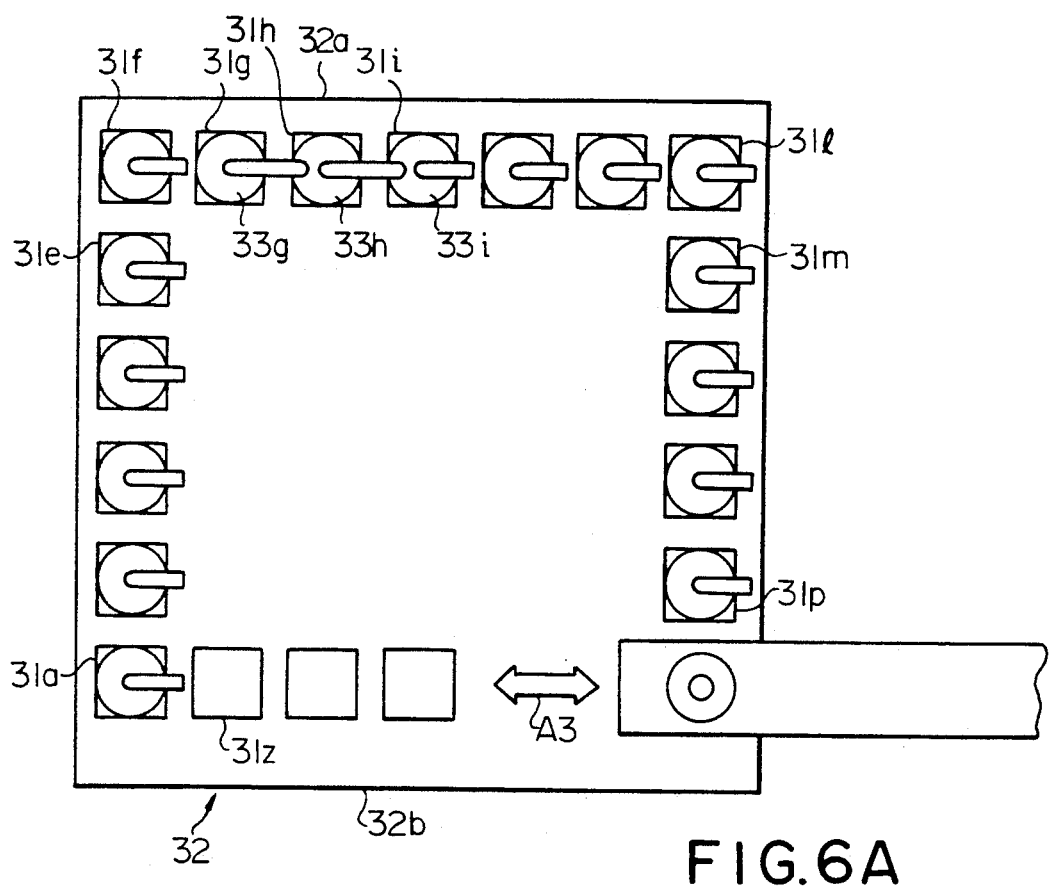
FIG. 6A is a plan view showing the arrangement of the bumps formed through the sequence illustrated in FIGS. 3A to 3H.
Figure 6B:
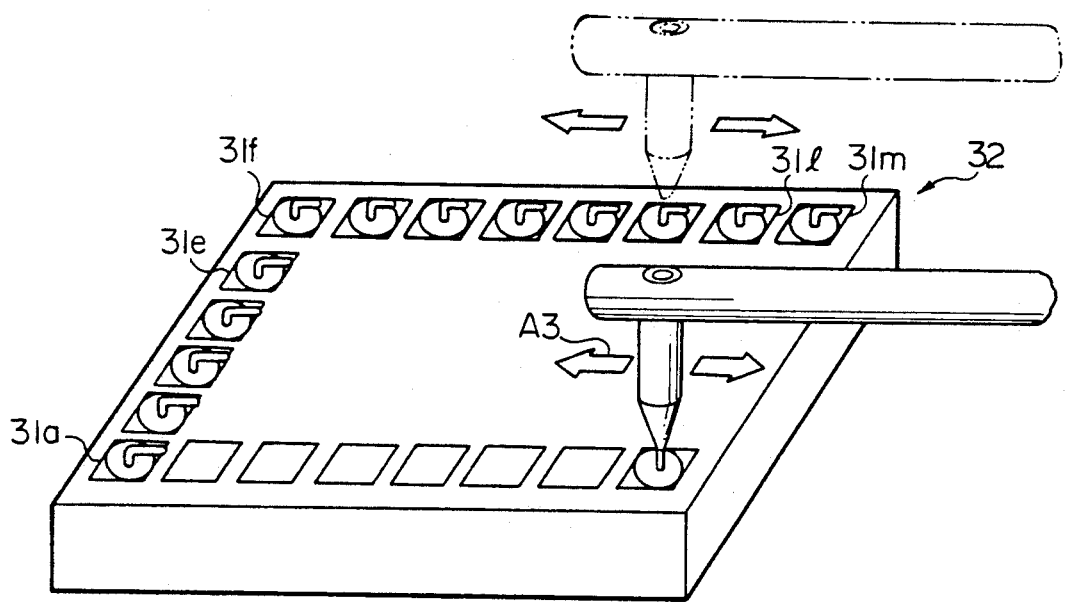
FIG. 6B is a perspective view showing the arrangement of the bumps in a different of angle from FIG. 6A.
Figure 7:
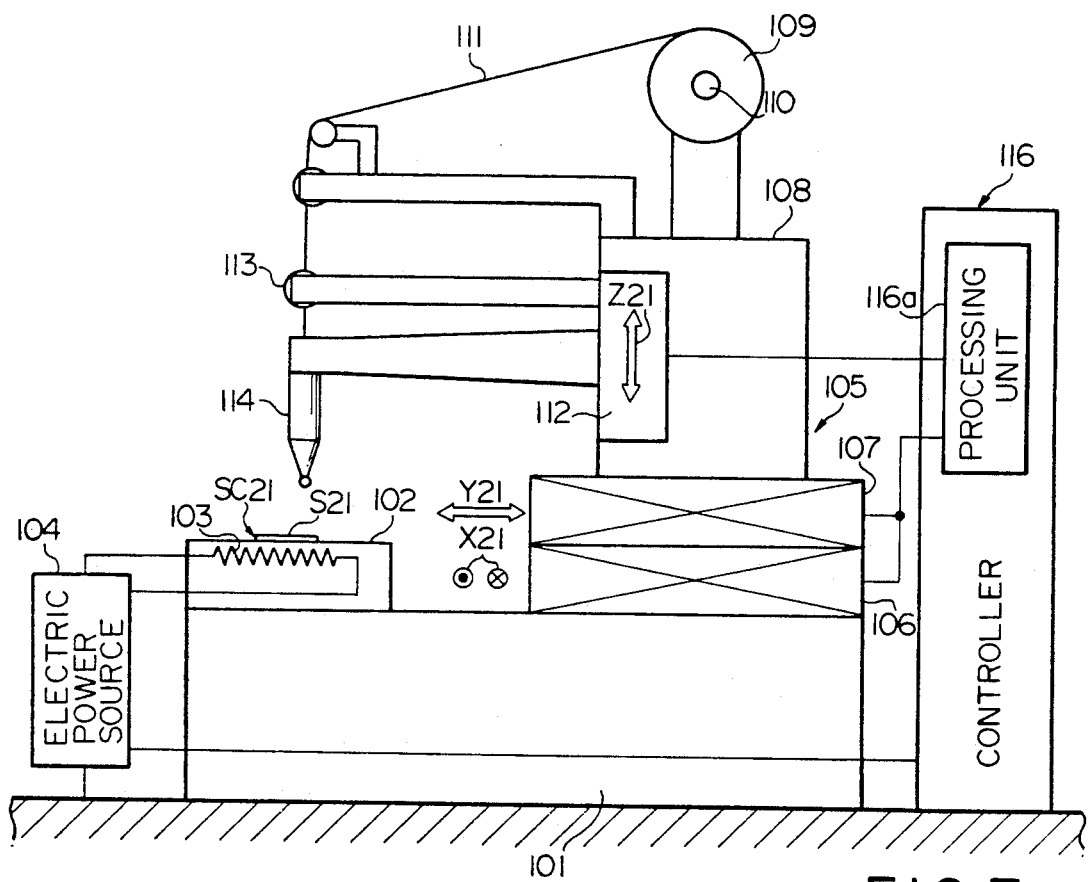
FIG. 7 is a side view showing a bonding apparatus according to the present invention.

Referring first to FIG. 7 of the drawings, a frame 101 is anchored to a ground floor, and a heating plate 102 associated with a heating element 103 coupled to an electric power source 104 is fixed on the upper surface of the frame 101. A semiconductor chip SC21 is placed on the heating plate 102, and the semiconductor chip SC21 has an upper surface S21. On the upper surface of the frame 101 is further provided a two-dimensionally movable table 105 which has a lower stage 106 movable in a first horizontal direction X21 with respect to the upper surface of the frame 101 and an upper stage 107 slidablly supported by the lower stage 106 and movable in a second horizontal direction Y21 perpendicular to the first horizontal direction X21. The first and second horizontal directions X21 and Y21 are substantially in parallel to the upper surface S21 of the semiconductor chip SC21. A bonding head 108 is supported by the upper stage 107 and, therefore, two-dimensionally movable with respect to the frame 101 and, accordingly, the semiconductor chip SC21. On the top surface of the bonding head 108 is provided a rotatable reel member 109 which is rotatable around a center axis 110, and a bonding wire 111 of, for example, an aluminum, gold or copper is wound on the outer periphery of the reel member 109. The bonding head 108 further has vertical driving mechanism 112 which in turn supports a clamper 113 and a capillary 114 laterally projecting therefrom. In this instance, the clamper 113 and the capillary 114 as a whole constitute a bonding tool.

The vertical driving mechanism 112 allows the clamper 113 and the capillary 114 to move in a perpendicular direction Z21 with respect to the upper surface of the semiconductor chip SC21. A spark rod 115 (see FIG. 9B) is provided in the vicinity of the capillary 114. The leading end 111a of the bonding wire 111 loosely passes through the capillary 114 and projects from the leading end 114a of the capillary 114 as shown in FIG. 9A.

A controller 116 is provided in association with the two-dimensionally movable table 105 as well a with the vertical driving mechanism 112, and the controller 116 controls the motions thereof with a processing unit 116a. Thus, the two-dimensionally movable table 105 and the vertical driving mechanism 112 allows the clamper 113 and the capillary 114 to three-dimensionally move with respect to the frame 101 and, accordingly, to the semiconductor chip SC21.

Figure 8:
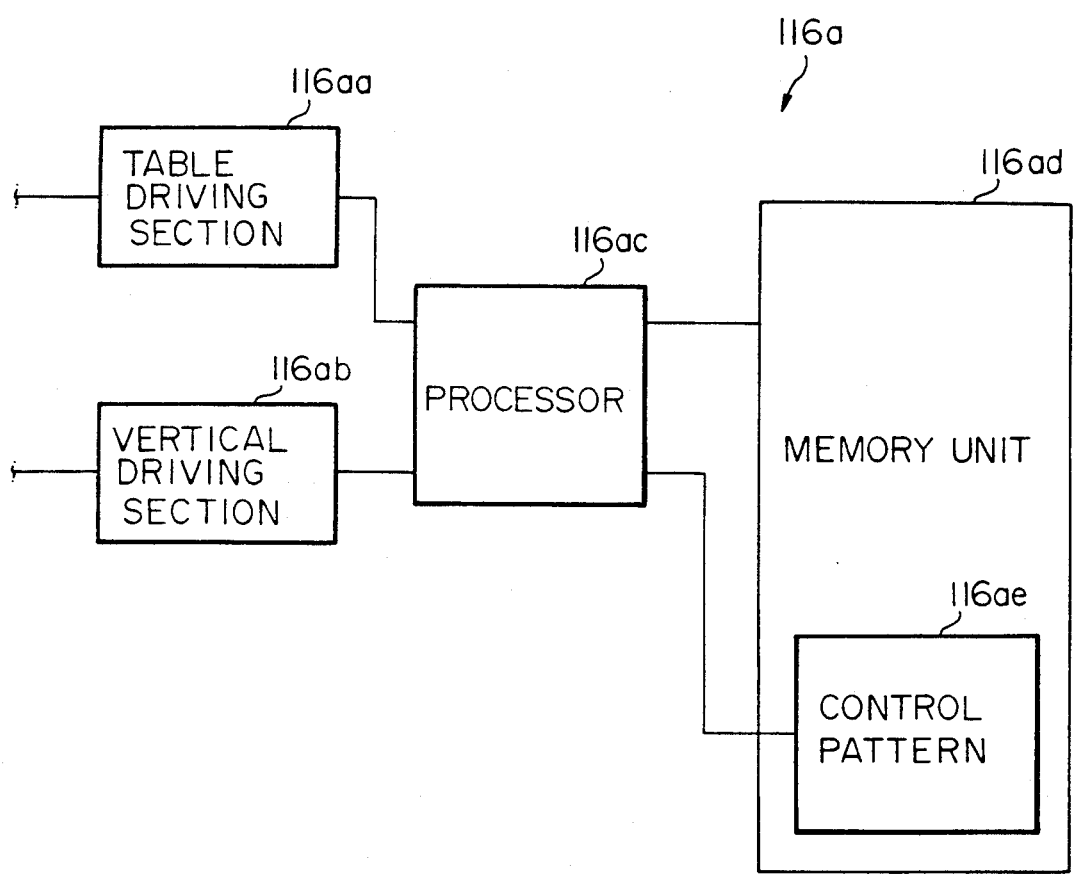
FIG. 8 is a block diagram showing a processing unit incorporated in a controller of the bonding apparatus shown in FIG. 7.

The processing unit 116a is illustrated in FIG. 8 and comprises a table driving section 116aa associated with the two-dimensionally movable table 105, a vertical driving section 116ab associated with the vertical driving mechanism 112, and a processor 116ac executing a program sequence memorized in a memory unit 116ad with reference to a control pattern 116ae for making a decision as will be described later.

Figures 9F, 9G, 9H, 9I:
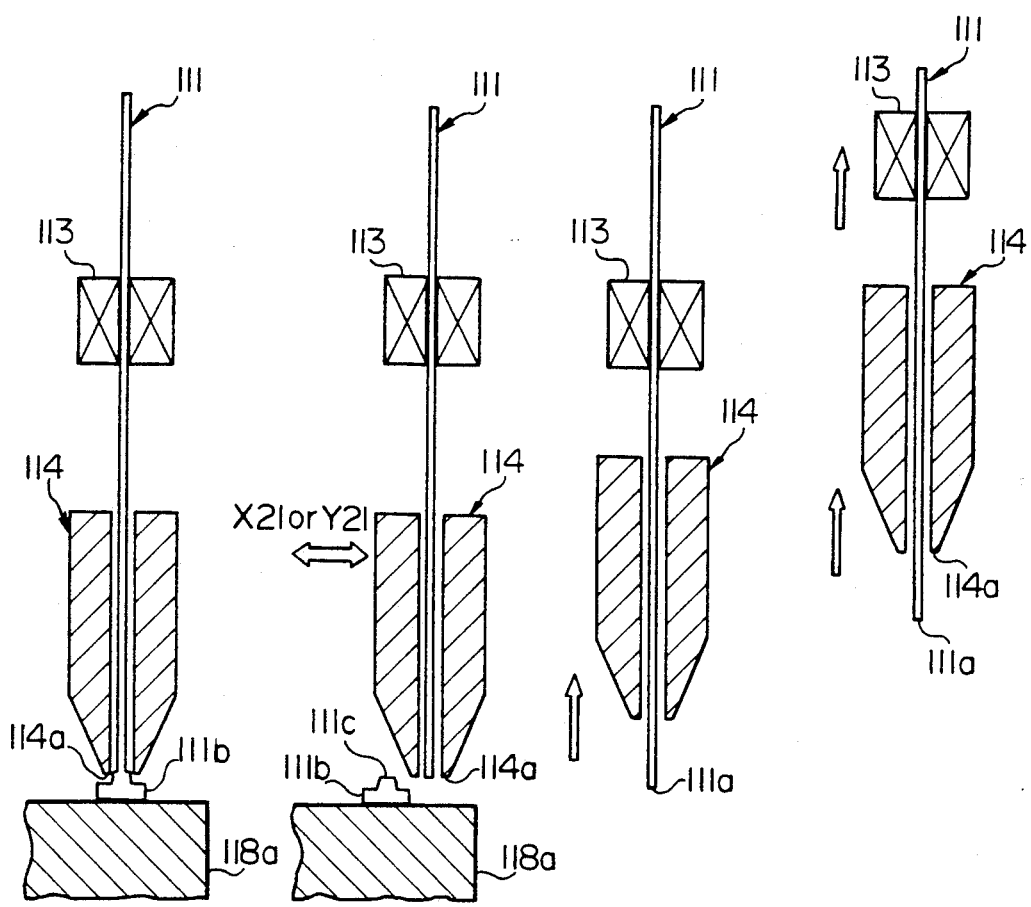

Description is hereinbelow made on a sequence of forming a bump with reference to FIGS. 9A to 9I. In a home position, the clamper 113 grasps the bonding wire 111, but the leading end 111a projects from the leading end 114a of the capillary 114 as shown in FIG. 9A. The controller 116 causes the clamper 113 and the capillary 114 to move toward the spark rod 115, and sparks 117 is produced between the spark rod 115 and the leading end 111a of the bonding wire 111 (see FIG. 9B). In the sparks 117 the leading end 111a is melted and becomes round so that a small ball 111b is produced at the leading end of the bonding wire 111 as shown in FIG. 9C.

Upon formation of the small ball 111b, the clamper 113 releases the bonding wire 111, and the capillary 114 goes down in a direction substantially parallel to the perpendicular direction Z21 (see FIG. 9D). The controller 116 causes the two-dimensionally movable table 105 and the vertical driving mechanism 112 to press the small ball 111b against an upper surface of an electrode 118a provided on the upper surface S21 of the semiconductor chip SC21. When the small ball 111b is pressed against the electrode 118a, the small ball 111b is crashed thereon for bonding thereto as shown in FIG. 9E.

The controller 116 causes the vertical driving mechanism 112 to slightly lift up the capillary 114 so that the leading end 114a of the capillary 114 is spaced apart from the crashed small ball 111b by a predetermined distance. When the capillary 114 is lifted up, the clamper 113 grasps the bonding wire 111 again as shown in FIG. 9F.

The controller 116 moves the two-dimensionally movable table 75 in either first or second horizontal direction X21 or Y21 depending upon the location of the electrode 118a and, accordingly, on the control pattern 116ae, and the capillary 114 and the clamper 113 are also moved in either first or second horizontal direction X21 or Y21. This results in that the bonding wire 111 is cut from the crashed small ball 111b with the leading end 114a of the capillary 114 as shown in FIG. 9G. However, a residual bonding wire 111c may be left on the crashed small ball 111b, and the residual bonding wire 111c and the crashed small ball 111b are used as a bump. However, the residual bonding wire 111c may be shaped so that the height thereof is regulated in a predetermined range.

The capillary moves upwardly so that the leading end 111a of the bonding wire projects from the leading end 114a of the capillary 114 again as shown in FIG. 9H.

Finally, the clamper 113 and the capillary 114 return to the home oposition as shown in FIG. 9I.

Thus, the bump is produced through the sequence illustrated in FIGS. 9A to 9I, and the sequence is repeated a predetermined number of times. As described hereinbefore, the capillary 114 is moved in either first or second horizontal direction depending upon the location of an electrode on the semiconductor chip SC21.

Figure 10A:
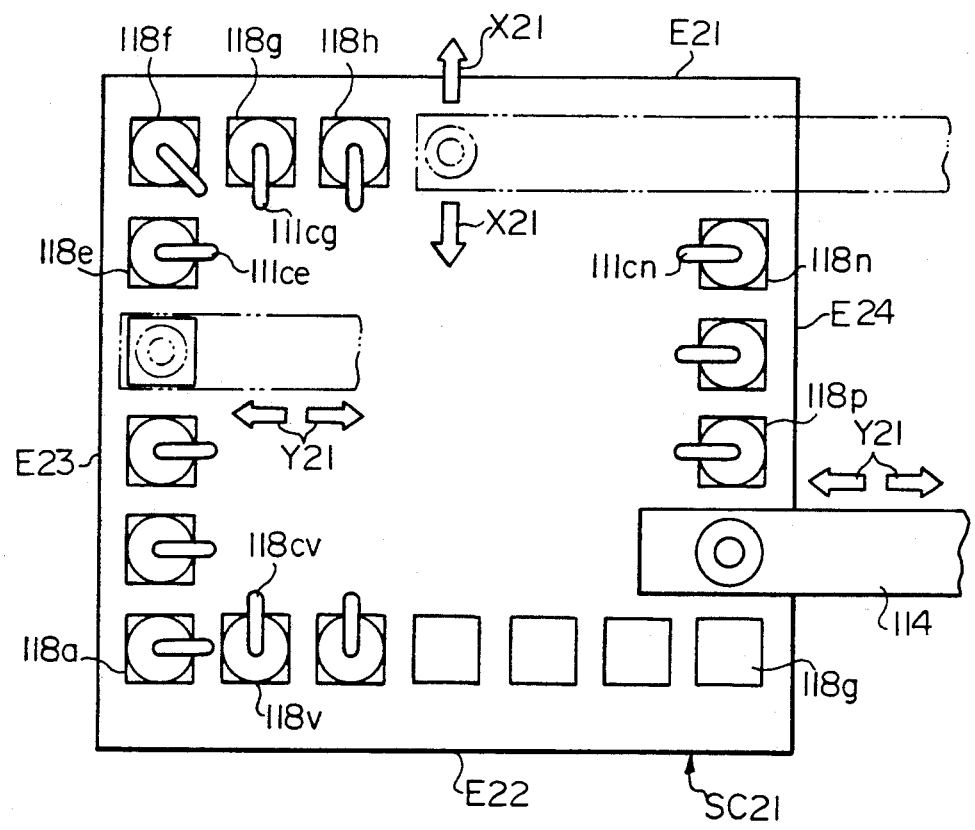
FIG. 10A is a plan view showing the arrangement of bumps provided on a semiconductor chip.
Figure 10B:
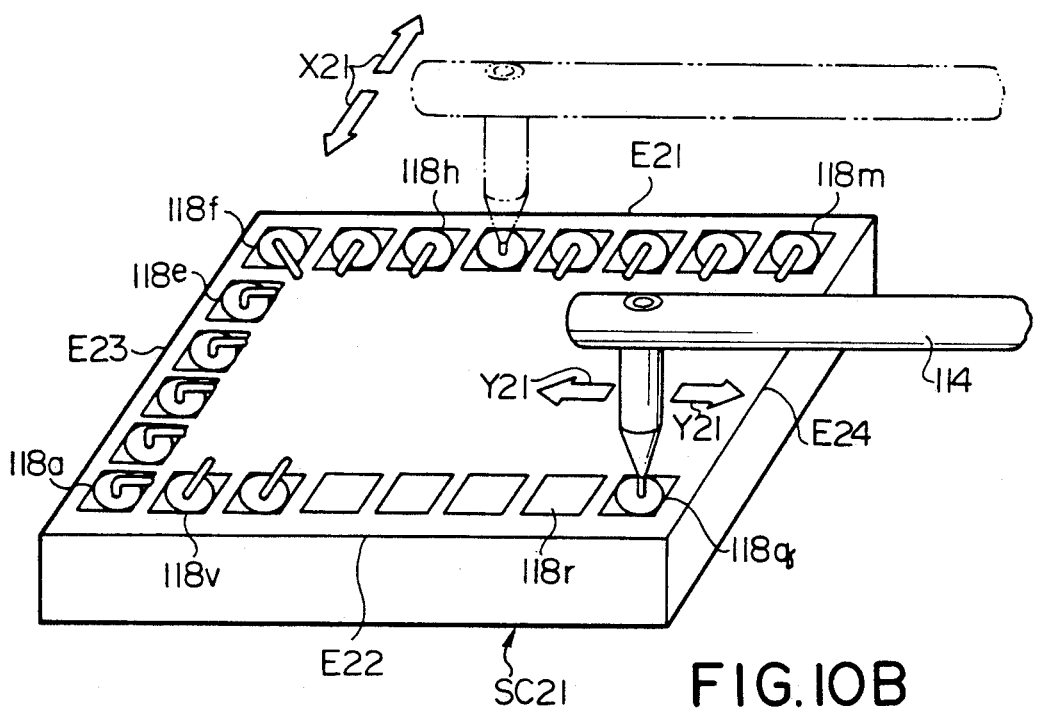
FIG. 10B is a perspective view showing the arrangement of the bumps shown in FIG. 10A in a different angle.

In detail, assuming now that a lot of electrodes including electrodes 118a to 118r are arranged along the outer periphery of the semiconductor chip SC21 as shown in FIGS. 10A and 10B, the capillary 114 is moved in the first horizontal direction X21 for producing bumps on the electrodes 118f to 118m and 118r to 118v which are located along the lateral edges E21 and E22, respectively. However, if the capillary 114 works for bumps on the electrodes 118a to 118e and 118n to 118p located along the side edges E23 and E24, respectively, the capillary 114 is moved in the second horizontal direction Y21. The control pattern 116ae gives the processor 116ac pieces of information each representing which direction the capillary 114 should move in, and the processor 116ac instructs the table driving section to actuate either lower or upper stage 106 or 107 in accordance with the piece of information to be fetched. The motion of the capillary 114 results in that the bumps on the different columns such as 118e and 118n have respective residual bonding wires 111ce and 111cn opposite to each other. If the residual bonding wires 111ce and 111cn are opposite to each other, any short circuiting hardly takes place between the adjacent electrodes such as 118e and 118f, and the vertical driving mechanism 112 may be roughly controlled for the vertical motion in comparison with the first embodiment because a fairly long residual bonding wire is acceptable. In the drawings, some of the residual wires are in contact with the semiconductor chip SC21, however, any serious problem takes place because the uppermost film of the semiconductor chip is formed of the insulating substance. Thus, the bumps formed on the respective electrodes 118a to 118v are free from the problem inherent in the prior art bumps, and such bumps are conducive to improvement of the production yield of the semiconductor device.

In this instance, the capillary 114 is laterally moved with respect to the semiconductor chip SC21, however, the semiconductor chip may be moved with respect to the capillary 114.

Second Embodiment

Figure 11A:
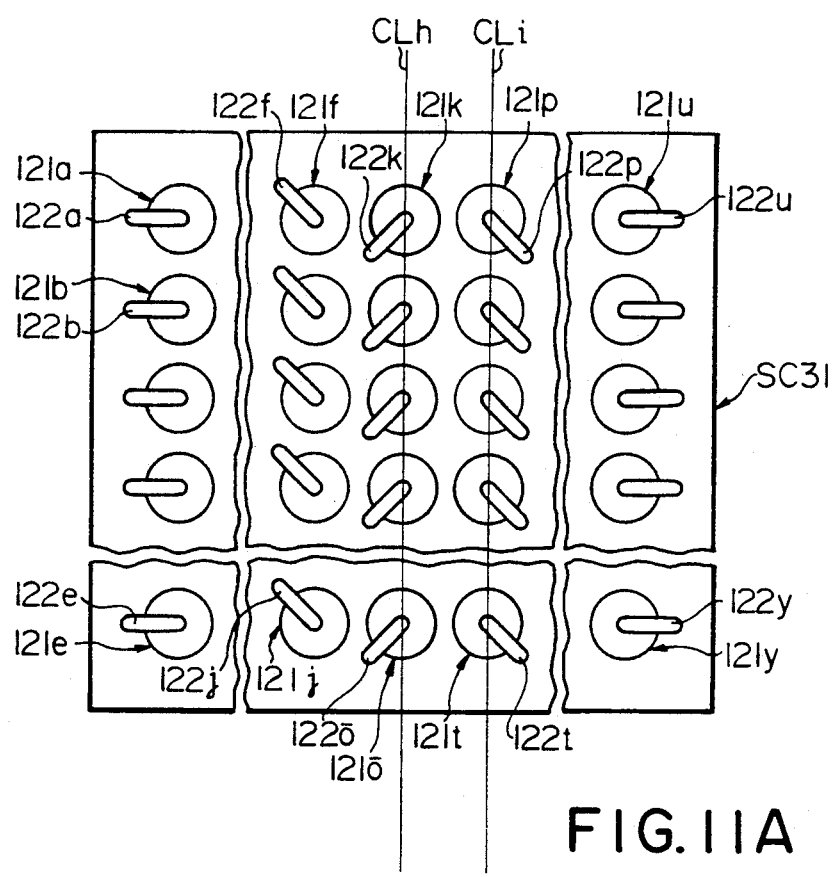
FIG. 11A is a plan view showing another arrangement of bumps on respective electrodes concentrated in a central portion of a semiconductor chip in accordance with the present invention.

Turning to FIGS. 11A, there is illustrated still another arrangement of bumps formed on electrodes (not shown) concentrated in a central area of a semiconductor chip SC31. Each of the bumps 121a to 121y are produced through the sequence shown in FIGS. 13A to 13I, and residual bonding wires 122a to 122y respectively projects from the crashed small balls. When the capillary 114 horizontally moves so as to cut the bonding wire 111 from the crashed small ball 111b, the processing unit 116a instructs the table driving section 116aa to actuate either or both of the lower and upper stages 106 and 107, but a horizontal direction of the resultant motion is dependent to the column of the electrodes. Namely, the processor instructs the table driving section to actuate the upper stage 117 so that the capillary 114 moves leftwardly for producing the bumps 121a to 121e arranged in the leftmost column, however, the capillary 114 obliquely moves upon actuation of both of the lower and upper stages 116 and 117 and the residual bonding wires 122f to 122j are directed in parallel toward the upper edge of the left side. The processor also causes the table driving section 116aa to actuate both of the lower and upper stages 116 and 117 for the bumps 121k to 121o in column CLh, but the resultant motions are different in angle from those for the bumps 121f to 121j by about 90 degrees in the counter-clock wise direction. Similarly, the resultant motions of the capillary 114 for the bumps 121p to 121t in the column CLi are further different in angle from those for the bumps in the column CLh by about 90 degrees in the counter-clock wise direction. Thus, the residual bonding wires 122a to 122y are directed to respective directions depending upon the columns or the location of the bump, and the residual bonding wires 122a to 122y are hardly brought into contact with any electrode in the adjacent column, because the orientation of residual bonding wire is equivalent to expansion of a gap between the electrodes.

Figure 15A:
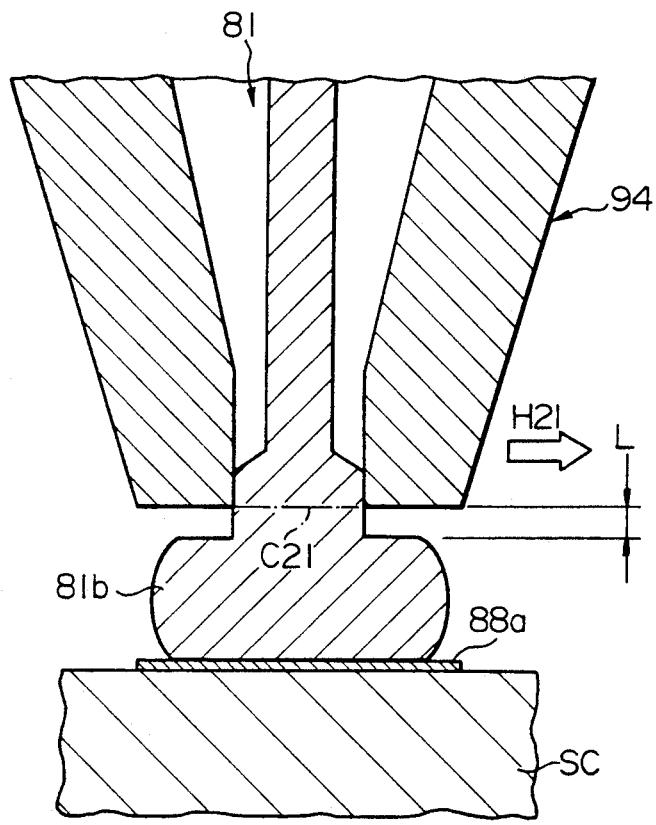
FIGS. 15A and 15B are cross sectional views showing a part of another sequence according to the present invention.
Figure 15B:
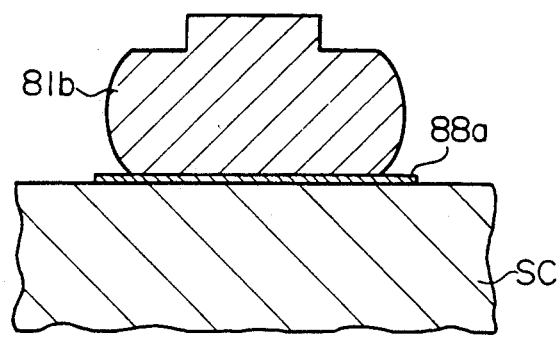

The residual bonding wire of the bump in one column is directed to one direction different from that of the bump in another column; however, if the semiconductor chip SC31 is turned over 90 degrees, the columns CLh and CLi form rows Rh and Ri, respectively as shown in FIG. 15B, and, for this reason, word "column" in claims is replaceable with word "row".

Third Embodiment

Figure 12:
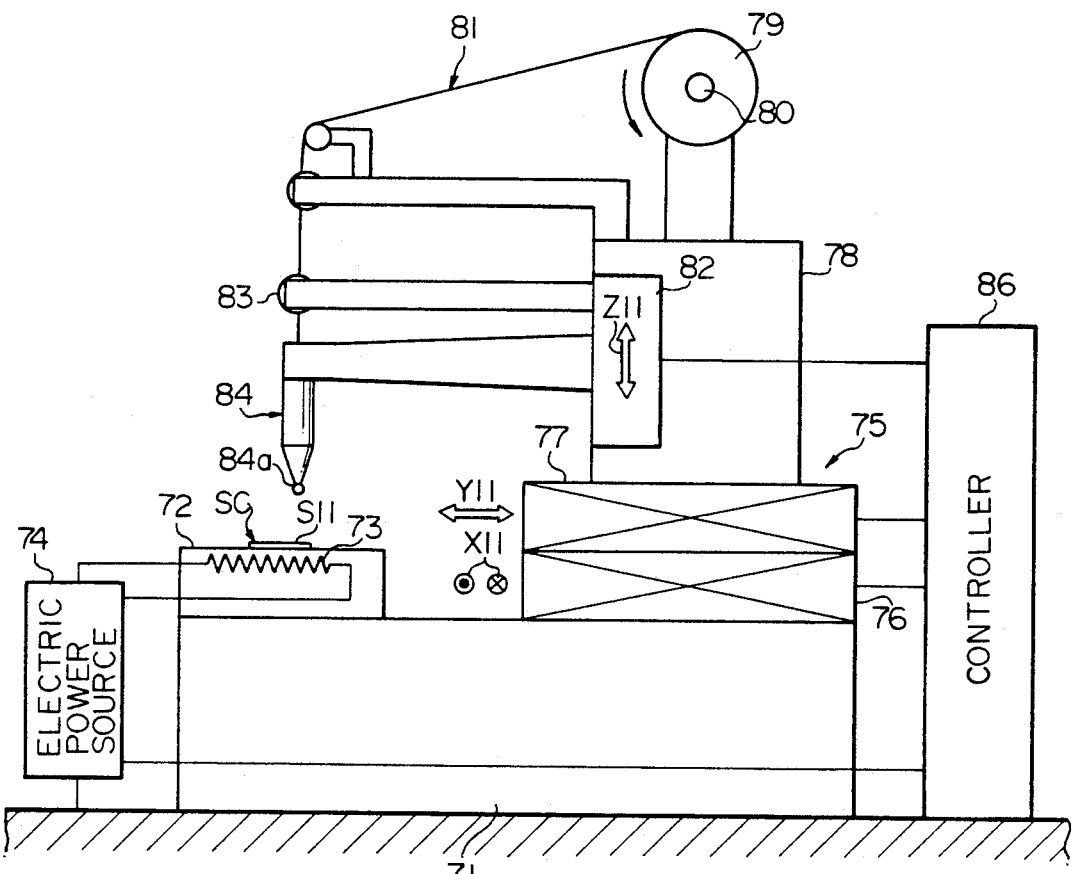
FIG. 12 is a side view showing another bonding apparatus according to the present invention.

Referring first to FIG. 12 of the drawings, a frame 71 is anchored to a ground floor, and a heating plate 72 associated with a heating element 73 coupled to an electric power source 74 is fixed on the upper surface of the frame 71. A semiconductor chip SC is placed on the heating plate 72, and the semiconductor chip SC has an upper surface S11. On the upper surface of the frame 71 is further provided a two-dimensionally movable table 75 which has a lower stage 76 movable in a first horizontal direction X11 with respect to the upper surface of the frame 71 and an upper stage 77 slidablly supported by the lower stage 76 and movable in a second horizontal direction Y11 perpendicular to the first horizontal direction X11. The first and second horizontal directions X11 and Y11 are substantially in parallel to the upper surface S11 of the semiconductor chip SC. A bonding head 78 is supported by the upper stage 77 and, therefore, two-dimensionally movable with respect to the frame 71 and, accordingly, the semiconductor chip SC. In other words, a clamper 83 and a capillary 84 can be moved in any direction on a virtual plane defined by the first and second horizontal directions X11 and Y11.

On the top surface of the bonding head 78 is provided a rotatable reel member 79 which is rotatable around a center axis 80, and a bonding wire 81 of, for example, an aluminum, gold or copper is wound on the outer periphery of the reel member 79. The bonding head 78 further has a vertical driving mechanism 82 which in turn has the clamper 83 and the capillary 84 laterally projecting therefrom. In this instance, the clamper 83 and the capillary 84 as a whole constitute a bonding tool.

The vertical driving mechanism 82 allows the clamper 83 and the capillary 84 to move in a perpendicular direction Z11 with respect to the upper surface of the semiconductor chip SC. A spark rod 85 (see FIG. 13B) is provided in the vicinity of the capillary 84. The leading end 81a of the bording wire 81 loosely passes through the capillary 84 and projects from the leading end 84a of the capillary 84 as shown in FIG. 13A.

A controller 86 is provided in association with the two-dimensionally movable table 75 as well as with the vertical driving mechanism 82, and the controller 86 controls the motions thereof. Thus, the two-dimensionally movable table 75 and the vertical driving mechanism 82 allows the clamper 83 and the capillary 84 to three-dimensionally move with respect to the frame 71 and, accordingly, to the semiconductor chip SC. In this instance, the controller 86 controls the motion of the vertical mechanism 82 with a unit length equal to about 5 microns or about 2.5 microns. In other words, the controller 86 has a resolution equal to or less than about 5 microns for the vertical motion of the driving mechanism 82. However, the precise control for the vertical motion is effective against the problems inherent in the prior art bumps in so far as the resolution is of the order of 15 microns as will be described hereinbelow.

Description is hereinbelow made on a sequence of forming a bump with reference to FIGS. 13A to 13I. In a home position, the clamper 83 grasps the bonding wire 81, but the leading end 81a projects from the leading end 84a of the capillary 84 as shown in FIG. 13A. The controller 86 causes the clamper 83 and the capillary 84 to move toward the spark rod 85, and sparks 87, then, takes place between the spark rod 85 and the leading end 81a of the bonding wire 81 (see FIG. 13B). In the sparks 87 the leading end 81a is melted and becomes round so that a small ball 81b is produced at the leading end of the bonding wire 81 as shown in FIG. 13C.

Upon formation of the small ball 81b, the clamper 83 releases the bonding wire 81, and the capillary 84 goes down in a direction substantially parallel to the perpendicular direction Z11 (see FIG. 13D). In this stage, the clamper 83 either stays or moves together with the capillary 84. The controller 86 causes the two-dimensionally movable table 75 and the vertical driving mechanism 82 to press the small ball 81b against an upper surface of an electrode 88a provided on the upper surface S11 of the semiconductor chip SC. When the small ball 81b is pressed against the electrode 88a, the small ball 81b is crashed thereon for bonding thereto as shown in FIG. 13E.

The controller 86 causes the vertical driving mechanism 82 to slightly lift up the capillary 84 so that the leading end 84a of the capillary 84 is spaced apart from the crashed small ball 81b by a predetermined distance. The predetermined distance may be variable depending upon a distance between adjacent two electrodes on the semiconductor chip SC; however, the predetermined distance is several microns in this instance. When the capillary 84 is lifted up, the clamper 83 grasps the bonding wire 81 again as shown in FIG. 13F.

Since the controller 86 moves the two-dimensionally movable table 75 in either first or second horizontal direction X11 or Y11 regardless of the location of the electrode 88a, the capillary 84 and the clamper 83 are also moved in either first or second direction X11 or Y11 by a distance of about 100 microns, and this results in that the bonding wire 81 is cut from the crashed small ball with the leading end 84a of the capillary 84 as shown in FIG. 13G. However, a negligible amount of a residual bonding wire 81c may be left on the crashed small ball 81b, and the residual bonding wire 81c and the crashed small ball 81b are used as a bump. The residual bonding wire may be shaped so that the height thereof is regulated in a predetermined range.

As described hereinbefore, the capillary 84 is moved in any direction on the virtual plane defined by the first and second horizontal direction X11 and Y11. If the controller 86 is similar to that shown in FIG. 8, each of the residual bonding wires 81c is oriented in an individual direction depending upon the location of the electrode 88a, and the bump has advantages in regulation of configuration as well as in free from any short circuiting. However, if the clamper 83 and the capillary 84 are moved in either first or second horizontal direction X11 or Y11 regardless of the location of the electrode 88a, the controller 86 is relatively simple in comparison with that incorporated in the first embodiment, and any undesirable short circuiting takes place because of the precise control of the lifting motion.

The capillary moves upwardly so that the leading end 81a of the bonding wire projects from the leading end 84a of the capillary 84 again as shown in FIG. 13H. Finally, the clamper 83 and the capillary 84 return to the home position as shown in FIG. 13I.

Thus, the bump is produced through the sequence illustrated in FIGS. 13A to 13I, and the sequence is repeated a predetermined number of times because the semiconductor chip SC usually has a lot of electrodes.

Figure 14A:
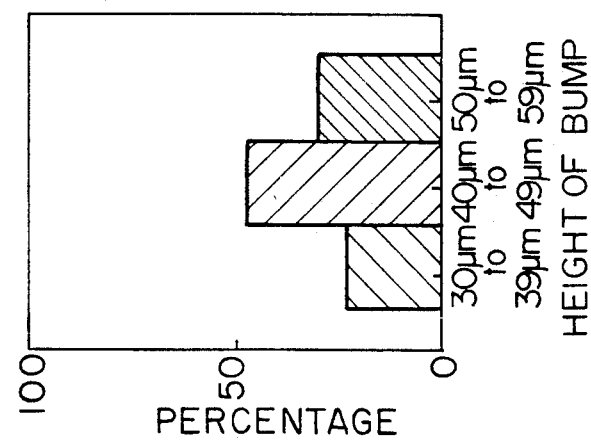
FIGS. 14A to 14C are histograms each showing the dispersion of the height of bumps in terms of a resolution of the motion of a vertical driving mechanism incorporated in the bonding apparatus shown in FIG. 12.
Figure 14B:
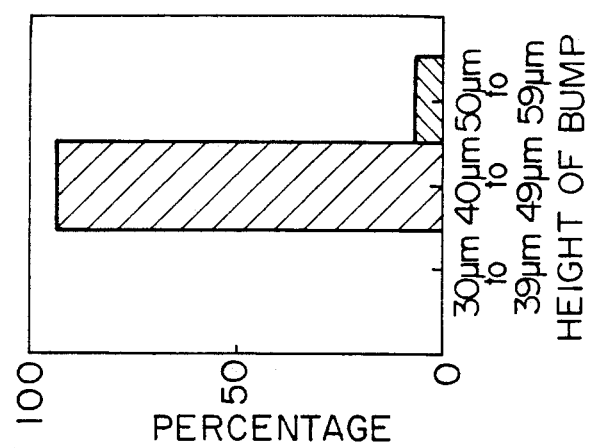
Figure 14C:
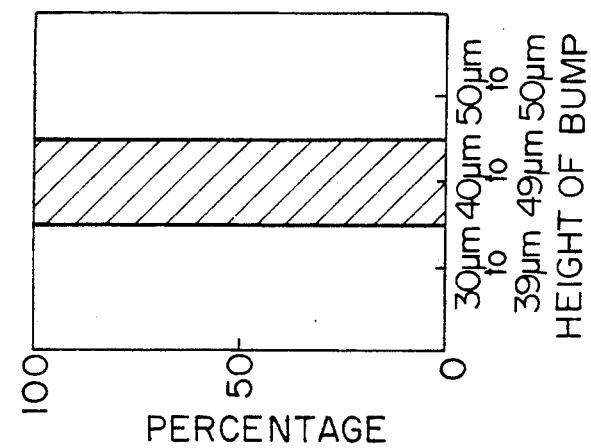

As will be understood from the foregoing description, the vertical driving mechanism 82 has a resolution ranging from 5 microns to 15 microns, and the bonding wire 81 is from the crashed small ball 81b with the leading end 84a of the capillary 84. This results in that the height of bump is easily regulated within a narrow range, and, for this reason, no long residual bonding wire takes place on the bump. This means that any short circuiting hardly takes place between two adjacent electrodes on the semiconductor chip SC, and, therefore, the production yield is drastically improved. In fact, if the resolution of the vertical motion is about 10 microns, bumps within a target range from 40 microns to 49 microns are of the order of 50 percent but most of the bumps are fallen within a range from 30 microns to 59 microns as shown in FIG. 14A. This means that the dispersion is only ±10 microns with respect to the target range. Moreover, if the resolution is about 5 microns, more than 92 percent of the bumps are fallen within the target range as shown in FIG. 14B. If the resolution is adjusted to about 2.5 microns, all of the bumps are fallen within the target range as shown in FIG. 14C.

In the third embodiment, the capillary 84 is laterally moved with respect to the semiconductor chip SC fixed on the heating plate 73. However, the semiconductor chip may be laterally moved with respect to the capillary 84 stationary with respect to the frame 71.

Fourth Embodiment

Turning to FIGS. 15A and 15B, there is shown an essential part of still another sequence according to the present invention. The sequence is similar to that shown in FIGS. 13A to 13I except for stages shown in FIGS. 13F and 13G, and the stages shown in FIGS. 15A and 15B correspond to those shown in FIGS. 13F and 13G. For this reason, description is focused on those stages with reference to FIGS. 15A and 15B.

When the small ball 81b is crashed onto the electrode 88a for bonding thereto, a part of the small ball 81b penetrates into a gap between a capillary 94 and the bonding wire 81. The capillary 84 is, then, lifted up by a predetermined distance L ranging from about 5 microns to about 15 microns, but the part of the crashed small ball 81b is still left in the gap. Since the capillary 84 is laterally moved as indicated by allow H21, the part of the crashed small ball 81b is cut along line C21, and no residual bonding wire is left on the crashed small ball 81b as shown in FIG. 15B. This conducive to regulation of the height of bump, and no shaping operation may follow. In this instance, the capillary 94 is moved in any direction on the virtual plane defined by the first and second horizontal directions X11 and Y11 depending upon the location of the electrode 88a. However, the capillary 94 may be moved in either first or second direction X11 or Y11 so that the controller 86 is simplified in program sequence.

Although particular embodiments of the present invention have been shown and described, it will be obvious to those skilled in the art that various changes and modifications may be made without departing from the spirit and scope of the present invention For example, the small balls 81b and 111b are produced by the agency of either thermal energy or supersonic vibration.

What is claimed is:

1. A process of forming bumps on respective electrodes of a semiconductor chip, said electrodes being arranged in at least first and second columns, said process comprising the steps of:
    a) preparing a bonding apparatus equipped with a bonding tool movable in a first horizontal direction substantially parallel to an upper surface of said electrode, in a second horizontal direction substantially parallel to the upper surface of the electrode and substantially perpendicular to the first horizontal direction and in a vertical direction perpendicular to the upper surface of the electrode, a wire passsing through said bonding tool;
    b) forming a small ball at a leading end of said wire, said small ball projecting from a leading end of said bonding tool;
    c) causing said bonding tool to press said small ball against the upper surface of one of said electrodes in said first column for bonding thereto;
    d) moving said bonding tool in a direction leaving from the upper surface of said electrodes;
    e) moving said bonding tool in a predetermined direction on a virtual plane defined by said first and second horizontal directions so that said wire is cut from said small ball with a leading end of said bonding tool, a residual wire being left on said small ball; and
    f) repeating said steps b) to e) for producing bumps on respective upper surfaces of the other electrodes, in which said predetermined direction for producing said bump on one of said electrodes in said first column is different from that for producing said bump on the upper surface of another electrode in said second column, and in which said semiconductor chip has a generally rectangular upper surface with two side edges, wherein said first and second columns are located along said two side edges, respectively, said predetermined direction for producing each bump in said first column being substantially in parallel with a direction form one of said side edges to a center of said rectangular upper surface, said predetermined direction for producing each bump in said second column being substantially in parallel to a direction from the other side edge to the center of said rectangular upper surface.

2. A process of forming a bump on an electrode of a semiconductor chip adjacent to another electrode, said process comprising the steps of:

a) preparing a bonding apparatus equipped with a bonding tool movable in a first horizontal direction substantially parallel to an upper surface of said electrode, in a second horizontal direction substantially parallel to the upper surface of the electrode and substantially perpendicular to the first horizontal direction and in a vertical direction perpendicular to the upper surface of the electrode, a wire passing through said bonding tool;

b) forming a small ball at the leading end of said wire, said small ball projecting from a leading end of said bonding tool;

c) causing said bonding tool to press said small ball against the upper surface of said electrode for bonding thereto;

d) moving said bonding too in a direction leaving from the upper surface of said electrode by a distance decided in such a manner than a residual wire left on said small ball after the subsequent step e) does not extend over a gap between said electrode and said another electrode, said distance being controlled with a unit value equal to or less than about 5 microns; and e) moving one of said semiconductor chip and said bonding tool in a horizontal direction substantially parallel to the upper surface of said electrode so that said wire is cut from said small ball with a leading end of said bonding tool, in which a part of said small ball penetrates into a gap between said bonding tool and said wire upon pressing said small ball against the upper surface of said electrode, and in which said bonding tool cuts an upper edge portion of the part of said small ball when one of said bonding tool and said semiconductor chip is moved in said horizontal direction in said step e).

3. A process of forming bumps on respective electrodes of a semiconductor chip, said electrodes being arranged in at least first and second columns, said process comprising the steps of:

a) preparing a bonding apparatus equipped with a bonding tool movable in a first horizontal direction substantially parallel to an upper surface of said electrode, in a second horizontal direction substantially parallel to the upper surface of the electrode and substantially perpendicular to the first horizontal direction and in a vertical direction perpendicular to the upper surface of the electrode, a wire passing through said bonding tool;

b) forming a small ball at the leading end of said wire, said small ball projecting from the leading end of said bonding tool;

c) causing said bonding tool to press said small ball against the upper surface of one of said electrodes in said first column for bonding thereto;

d) moving said bonding tool in a direction leaving from the upper surface of said electrode;

e) moving said bonding tool in a predetermined direction on a virtual plane defined by said first and second horizontal directions so that said wire is cut from said small ball with the leading end of said bonding tool, a residual wire being left on said small ball; and f) repeating said steps b) to e) for producing bumps on respective upper surfaces of the other electrodes, in which said predetermined direction for producing said bump on said one of said electrodes in said first column is different form that for producing said bump on the upper surface of another electrode in said second column, and in which said semiconductor chip has a generally rectangular upper surface, wherein said first and second columns are located in a central area of said generally rectangular upper surface, said predetermined direction for producing each bump in said first column being different in angle from that for producing each bump in said second column.

* * * * *